(12) United States Patent
Frantzeskakis et al.

(10) Patent No.: US 8,686,771 B2
(45) Date of Patent: Apr. 1, 2014

(54) DIGITAL PHASE-LOCKED LOOP WITH WIDE CAPTURE RANGE, LOW PHASE NOISE, AND REDUCED SPURS

(75) Inventors: Emmanouil Frantzeskakis, Ilioupolis (GR); Ioannis L. Syllaios, Costa Mesa, CA (US); Georgios Sfikas, Glyfada (GR); Henrik Jensen, Long Beach, CA (US); Stephen Wu, Fountain Valley, CA (US); Padmanava Sen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/485,413

(22) Filed: May 31, 2012

(65) Prior Publication Data

US 2013/0113528 A1    May 9, 2013

Related U.S. Application Data

(60) Provisional application No. 61/556,094, filed on Nov. 4, 2011.

(30) Foreign Application Priority Data

May 18, 2012   (GR) .............................. 20120100265

(51) Int. Cl.
*H03L 7/06*       (2006.01)
(52) U.S. Cl.
USPC ......................................... 327/159; 327/150

(58) Field of Classification Search
None
See application file for complete search history.

(56) References Cited

U.S. PATENT DOCUMENTS

| | | | | |
|---|---|---|---|---|
| 7,801,262 | B2* | 9/2010 | Wallberg et al. | 375/376 |
| 8,344,772 | B2* | 1/2013 | Lee et al. | 327/156 |
| 8,362,815 | B2* | 1/2013 | Pavlovic et al. | 327/156 |
| 8,384,451 | B2* | 2/2013 | Matsuda | 327/156 |
| 8,471,611 | B2* | 6/2013 | Sfikas et al. | 327/156 |
| 8,531,219 | B1* | 9/2013 | Dunworth et al. | 327/156 |
| 2008/0315928 | A1* | 12/2008 | Waheed et al. | 327/159 |
| 2012/0063520 | A1* | 3/2012 | Deguchi et al. | 375/259 |

* cited by examiner

*Primary Examiner* — Cassandra Cox
(74) *Attorney, Agent, or Firm* — Sterne, Kessler, Goldstein & Fox P.L.L.C.

(57) ABSTRACT

The present disclosure is directed to digital phase-locked loops (DPLLs) and hybrid phase-locked loops (HPLL) for establishing and maintaining a phase relationship between a generated output signal and a reference input signal. The DPLLs use a counter based loop to initially bring the DPLL into lock. Thereafter, the DPLLs disable the counter based loop and switch to a loop with a multi-modulus divider (MMD). The DPLLs can implement a cancellation technique to reduce phase noise introduced by the MMD. The HPLLs further include a loop with a MMD. The HPLLs can implement a similar cancellation technique to reduce phase noise introduced by the MMD.

17 Claims, 11 Drawing Sheets

DIGITAL PHASE-LOCKED LOOP WITH WIDE CAPTURE RANGE, LOW PHASE NOISE, AND REDUCED SPURS

CROSS REFERENCE TO RELATED APPLICATIONS

This application claims the benefit of U.S. Provisional Patent Application No. 61/556,094, filed Nov. 4, 2011, which is incorporated by reference herein.

FIELD OF THE INVENTION

This application relates generally to phase-locked loops (PLLs) and more particularly to digital PLLs.

BACKGROUND

In a phase-locked loop (PLL), a phase frequency detector compares the phase and frequency of an output signal that is generated by a variable frequency oscillator to the phase and frequency of an input "reference" signal. Based on the comparison, the PLL adjusts the variable frequency oscillator to establish and maintain a constant phase relationship between the output signal and the input signal. Once the phase difference between the two signals becomes substantially constant in time, the PLL is said to be "in lock."

Often, rather than comparing the phase and frequency of the output signal directly to the phase and frequency of the input signal, a frequency divider is used to first reduce the frequency of the output signal by a division factor to generate a comparison signal. The phase frequency detector then compares the phase and frequency of the comparison signal to the phase and frequency of the input signal and any adjustment needed to the variable frequency oscillator is made based on this comparison.

The amount of frequency variation between the input signal and the comparison signal over which the PLL can adjust the variable frequency oscillator such that the frequencies of the two signals are made equal and the PLL acquires lock is referred to as the pull-in range. A digital PLL (DPLL) (i.e., a PLL that includes component(s) that process and/or provide discrete-time signals) often suffers from a limited pull-in range due to the implementation of its phase frequency detector. Solutions to extend the pull-in range of the DPLL exist. However, these solutions often come at the cost of increased phase noise and/or spurs on the output signal produced by the DPLL.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The embodiments of the present disclosure will be described with reference to the accompanying drawings. The drawing in which an element first appears is typically indicated by the leftmost digit(s) in the corresponding reference number.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring aspects of the invention.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

I. Digital Phase-Locked Loop with Limited Pull-in Range

A digital phase-locked loop (DPLL) has several advantages over an analog phase-locked loop (APLL). For example, the DPLL is generally more compact than the APLL. It can take advantage of decreasing process geometry sizes for integrated circuits and can avoid large loop filter capacitors that are common to the APLL. For this reason and others, the DPLL has become increasingly more prevalent in a wide variety of applications, including in frequency synthesizers and clock and data recovery circuits (CDRs).

Figure 1:
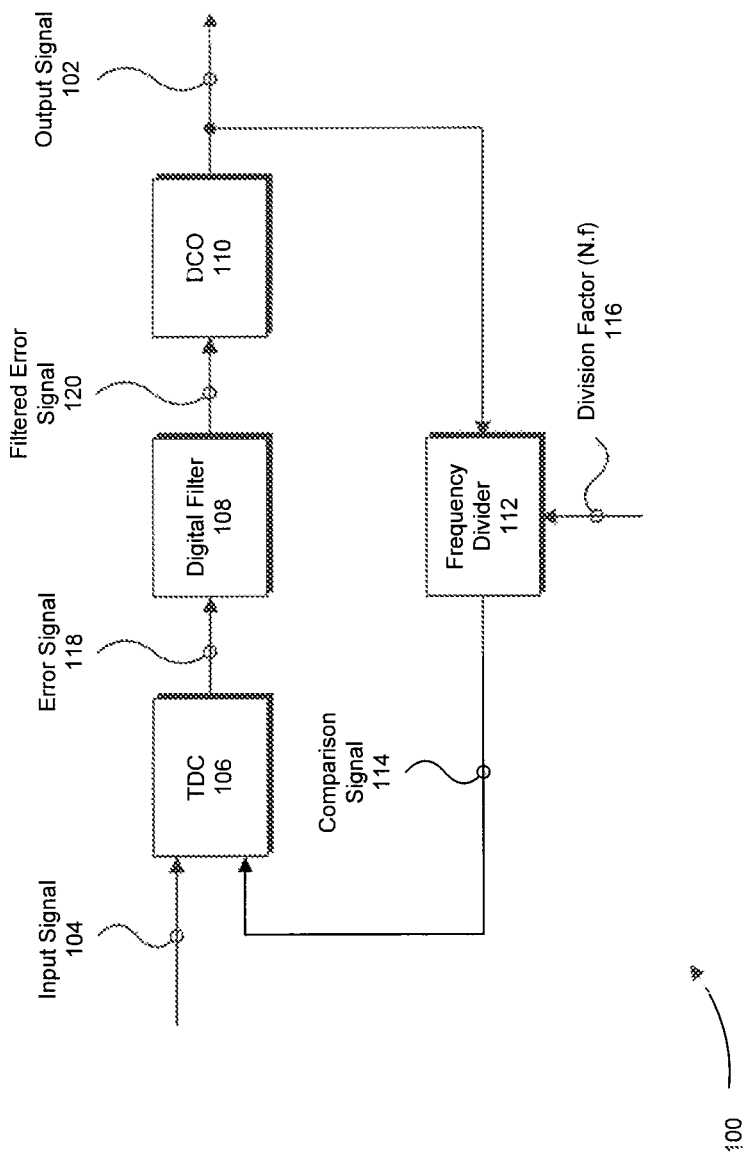
FIG. 1 illustrates a conventional digital PLL (DPLL).

FIG. 1 illustrates a conventional DPLL 100. In general, the conventional DPLL 100 is used to generate an output signal 102 having a desired output frequency from an input signal 104 having a given reference frequency. Often, the output signal 102 is a relatively high frequency signal and the input signal 104 is a relatively low frequency signal. Accordingly, the conventional DPLL 100 is used to generate the high frequency output signal 102 from the lower frequency input signal 104.

As shown in FIG. 1, the conventional DPLL 100 includes a time-to-digital converter (TDC) 106 that acts as a phase frequency detector, a digital filter 108, a digitally controlled oscillator (DCO) 110, and a frequency divider 112. The frequency divider 112 generates a comparison signal 114 based on the output signal 102. Specifically, the frequency divider 112 reduces the frequency of the output signal 102 by a division factor 116 that includes an integer (N) and fractional part (f). The TDC 106 generates an error signal 118 based on a difference in phase and frequency between the input signal 104 and the comparison signal 114. The digital filter 108 low-pass filters the error signal 118 to produce a filtered error signal 120. The filtered error signal 120 is then applied to the DCO 110 to correct for any phase and frequency error between the input signal 104 and the comparison signal 114 to either maintain the conventional DPLL 100 in a locked state or to bring the conventional DPLL 100 into a locked state.

The amount of frequency variation between the input signal 104 and the comparison signal 114 over which the conventional DPLL 100 can adjust the DCO 110 such that the frequencies of the two signals are made equal and the PLL acquires lock is referred to as the pull-in range. The conventional DPLL 100 generally suffers from a limited pull-in range due to the implementation of the TDC 106.

In general, the TDC 106 measures an unknown time interval $T_{int}$ between a rising (or falling) edge of the comparison signal 114 and the next rising (or falling) edge of the input signal 104 that follows thereafter. The TDC 106 typically measures the unknown time interval $T_{int}$ by counting how many intervals of a known reference duration $T_r$ are included in the unknown time interval $T_{int}$. The phase difference between the comparison signal 114 and the input signal 104 is, by definition, proportional to this measured value when the frequencies of the two signals are equal. Thus, the TDC 106 can typically perform adequate phase difference detection when the frequencies are equal. However, when the frequencies of the comparison signal 114 and the input signal 104 are different, it can be shown that the TDC 106 has a very limited range over which it can accurately determine the frequency difference using the general approach outlined above, which limits the pull-in range of the conventional DPLL 100. The TDC 106 can be, for example, a delay chain TDC, a Vernier TDC, a ring oscillator based TDC, or a stochastic TDC.

II. Digital Phase-Locked Loop with Wide Pull-in Range

Figure 2:
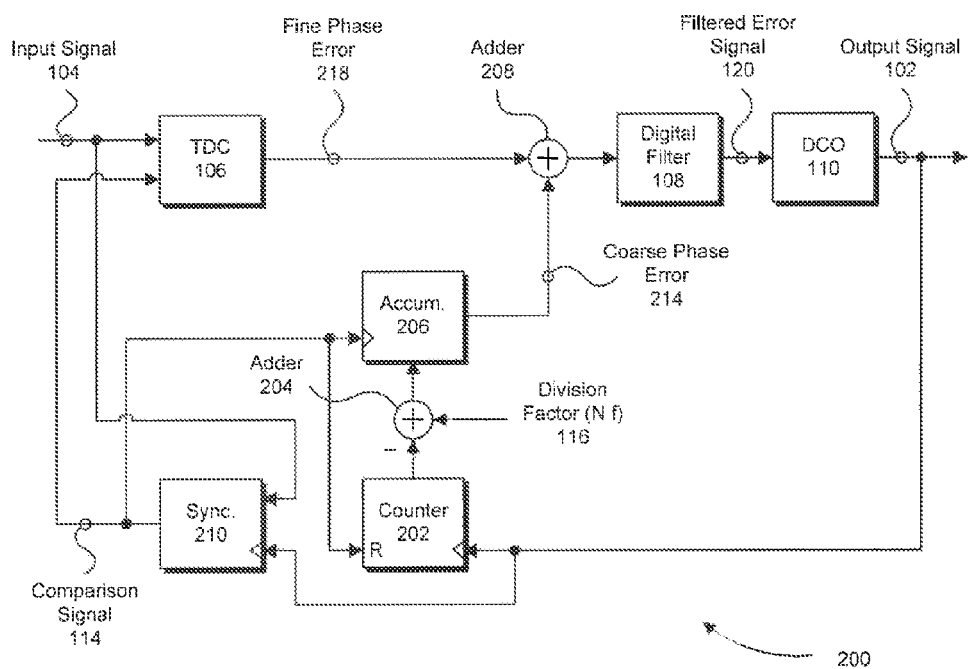
FIG. 2 illustrates a DPLL with a wide pull-in range in accordance with embodiments of the present disclosure.

FIG. 2 illustrates a DPLL 200 in accordance with embodiments of the present disclosure. The DPLL 200 improves upon the pull-in range of the conventional DPLL 100 illustrated in FIG. 1 by replacing the TDC 106 and the frequency divider 112 with a counter based loop that includes a counter 202, an adder 204, and an accumulator 206. The TDC 106, however, is still shown in FIG. 2 as an optional component that is included together with an adder 208 and a synchronizer 210 to improve the noise behavior of the DPLL 200.

Therefore, to explain the basic operation of the DPLL 200, it is instructive to first ignore the presence of the TDC 106, the adder 208, and the synchronizer 210 and assume that the accumulator 206 is clocked by the input signal 104 (as opposed to the comparison signal 114) and that the counter 202 is reset by the input signal 104 (as opposed to the comparison signal 114). Given this, the counter 202 estimates the number of full cycles of the output signal 102 that occur during a cycle of the input signal 104 by counting rising (or falling) edges of the output signal 102. This estimate is provided as output to the adder 204 and the counter 202 is thereafter reset by the input signal 104. The adder 204 determines the difference between the output of the counter 202 and the division factor 116, which includes an integer (N) and fractional part (f), to get a coarse frequency error. The accumulator 206 accumulates (or integrates) the coarse frequency error determined by the adder 204 to form a coarse phase error 214, which is then low-pass filtered by digital filter 108 and used to adjust the DCO 110.

Figure 3:
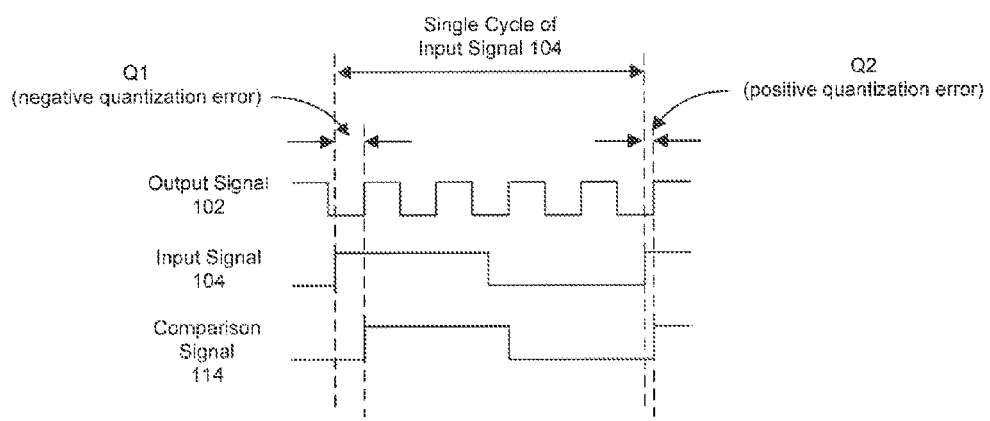
FIG. 3 illustrates a timing diagram for the DPLL illustrated in FIG. 2 in accordance with embodiments of the present disclosure.

FIG. 3 provides a timing diagram 300 that further illustrates the basic operation of the DPLL 200 as described above. The timing diagram 300 specifically illustrates an exemplary single cycle of the input signal 104 and a portion of the output signal 102 in relation thereto. Based on the signals shown in the timing diagram 300, the counter 202 estimates (by counting the rising (or falling) edges of the output signal 102) that four full cycles of the output signal 102 occur within the single cycle of the input signal 104. If there is no frequency error in the output signal 102, the number of cycles of the output signal 102 that should occur within the single cycle of the input signal 104 is given by the division factor 116. Thus, if we assume that the division factor 116 is set to a value of 4.2 (such that the frequency of the output signal 102 is ideally 4.2 times greater than the frequency of the input signal 104), the adder 204 will determine the presence of a frequency error proportional to (4−4.2) or −0.2 for the signals shown in the timing diagram 300. The frequency error determined by the adder 204 is subsequently accumulated by the accumulator 206 to provide the coarse phase error 214 used to adjust the DCO 110.

Ideally, the difference determined by the adder 204 is equal (or proportional) to the exact frequency error of the output signal 102. However, because the counter 202 has a resolution of one full cycle of the output signal 102, the counter 202 will over or under estimate the true number of cycles of the output signal 102 that occur within a cycle of the input signal 104 by up to 0.5 cycles. This error is commonly referred to as quantization error. The quantization error of the counter 202 for the specific example illustrated in FIG. 3 is given by the difference between Q2 and Q1 shown in the timing diagram 300. This quantization error, if not compensated for, can cause spurs in the frequency domain of the output signal 102.

The TDC 106, the adder 208, and the synchronizer 210 are optionally included in the DPLL 200 to reduce the effect of this quantization error. The synchronizer 210 synchronizes the input signal 104 with the output signal 102 and provides the synchronized input signal 104 as output via the comparison signal 114. For example, the synchronizer 210 can perform this synchronization by registering the input signal 104 in a storage element that is clocked by the output signal 102. Back to back registers can be used to prevent metastability issues. An example portion of the comparison signal 114 is further shown in the timing diagram 300 of FIG. 3.

The TDC 106 measures the difference in phase between the input signal 104 and the comparison signal 114 and generates a fine phase error 218. The adder 208 adds the fine phase error 218 to the coarse phase error 214 to compensate for the quantization error of the counter 202. It should be noted that, when the TDC 106 and the synchronizer 210 are used, the counter 202 is reset by the comparison signal 114 and the accumulator 206 is clocked by the comparison signal 114.

It should be further noted that, in other implementations of the DPLL 200, the digital filter 108 and/or the DCO 110 can be replaced by their analog equivalents (i.e., implementations that receive as input and/or provide as output continuous time signals as opposed to discrete time signals). For example, the digital filter 108 can be replaced by an analog filter and/or the DCO 110 can be replaced by a voltage controlled oscillator (VCO).

III. Digital Phase-Locked Loop with Wide Pull-in Range and Low Phase Noise

Although the DPLL 200 illustrated in FIG. 2 improves the pull-in range of the conventional DPLL by replacing the TDC 106 and the frequency divider 112 with a counter based loop, the use of the counter based loop has the disadvantage of increasing the phase noise of the output signal 102.

Figure 4:
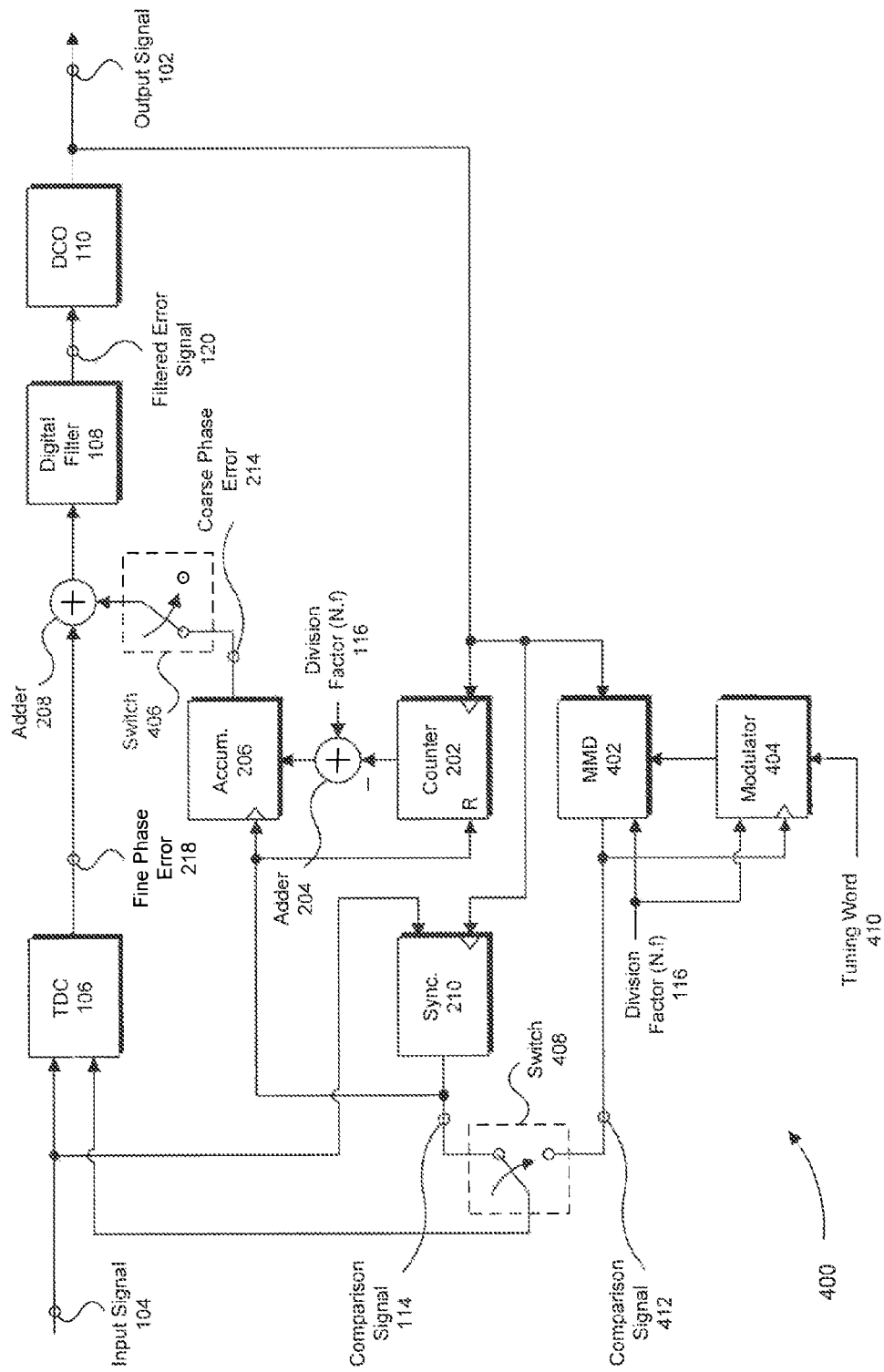
FIG. 4 illustrates a DPLL with a wide pull-in range and low phase noise in accordance with embodiments of the present disclosure.

FIG. 4 illustrates a solution to this disadvantage. In particular, FIG. 4 illustrates a DPLL 400 that modifies the basic configuration of the DPLL 200 to further include a multi-modulus divider (MMD) 402, a modulator 404, a switch 406, and a switch 408. The basic idea of the DPLL 400 is to use the wide pull-in range provided by the counter based loop (which includes the counter 202, the adder 204, and the accumulator 206) to initially bring the DPLL 400 into lock and then, once locked, switch to the loop containing the MMD 402 and the modulator 404 to improve the phase noise of the output signal 102. In another implementation, the DPLL 400 can switch between the counter based loop and the loop containing the MMD 402 and the modulator 404 based on other or alternative criteria.

When the counter based loop is enabled, the switch 406 is configured to provide the coarse phase error 214 to the adder 208, and the switch 408 is configured to provide the comparison signal 114 to the TDC 106. On the other hand, when the loop containing the MMD 402 and the modulator 404 is enabled, the switch 406 is configured to prevent the coarse phase error 214 from being provided to the adder 208, and the switch 408 is configured to provide the comparison signal 412 to the TDC 106. A controller (not shown) can be used to determine whether the loop is in a locked or non-locked state and can control the switches 406 and 408 accordingly. For example, the controller can monitor the input and/or the output of the digital filter 108 to determine whether the DPLL 400 is in a locked state.

Referring now to the MMD 402, this divider is configured to reduce the frequency of the output signal 102 using two or more integer division factors to generate a comparison signal 412. The modulator 404 controls the MMD 402 to alternately select the different integer division factors such that the MMD 402 reduces the frequency of the output signal 102, on average, by the fractional division factor 116. The modulator 404 includes at least one phase error accumulator for the purposes of determining when to adjust the division factor of the MMD 402.

For example, the MMD 402 can be implemented as a dual-modulus divider that reduces the frequency of the output signal 102 by two integer division factors: N and N+1, where N is set equal to the integer portion of the division factor 116. The phase error accumulator of the modulator 404 can be clocked by the comparison signal 412 and can increment by an amount determined by a tuning word 410 with each pulse of the comparison signal 412. When the phase error accumulator of the modulator 404 overflows, the divider ratio of the MMD 402 can be controlled by the modulator 404 to be set to the division factor N+1 for one cycle of the comparison signal 412 and to the division factor N at all other times. If the tuning word 410 is equal to k, and the modulus of the phase error accumulator is equal to M, the phase error accumulator will overflow, on average, k/M times for every cycle of the comparison signal 412. Given this, it can be shown that the fractional divide ratio of the MMD 402, on average, is given by N+(k/M). Thus, the value of k, which is the tuning word 410, can be determined based on the modulus M of the phase error accumulator such that the divide ratio of the MMD 402, on average, is equal to the fractional division factor 116.

After the comparison signal 412 is generated by the MMD 402, the TDC 106 generates a fine phase error signal 218 based on the difference in phase between the input signal 104 and the comparison signal 412. The digital filter 108 low-pass filters the fine phase error signal 218 to produce a filtered error signal 120. The filtered error signal 120 is then applied to the DCO 110 to correct for any phase error between the input signal 104 and the comparison signal 412.

One concern with the MMD 402 is that it introduces phase noise into the comparison signal 412 through the use of integer division factors that are not exactly equal to the fractional division factor 116. The phase noise typically changes abruptly when the MMD 402 switches from one integer division factor to another resulting in spikes at the output of the TDC 106. Because the MMD 402 generally switches from one integer division factor to another on a periodic basis, the spikes can and often do appear as spurs in the frequency domain of the output signal 102.

One approach to reduce these spurs is by implementing the modulator 404 as a delta-sigma modulator to randomize the sequence in which the integer division factors of the MMD 402 are selected. Although using a delta-sigma modulator is a viable solution, this approach generally comes at the cost of higher, non-deterministic phase noise in the output signal 102.

It should be noted that, in other implementations of the DPLL 400, the digital filter 108 and/or the DCO 110 can be replaced by their analog equivalents (i.e., implementations that receive as input and/or provide as output continuous time signals as opposed to discrete time signals). For example, the digital filter 108 can be replaced by an analog filter and/or the DCO 110 can be replaced by a voltage controlled oscillator (VCO).

Figure 5:
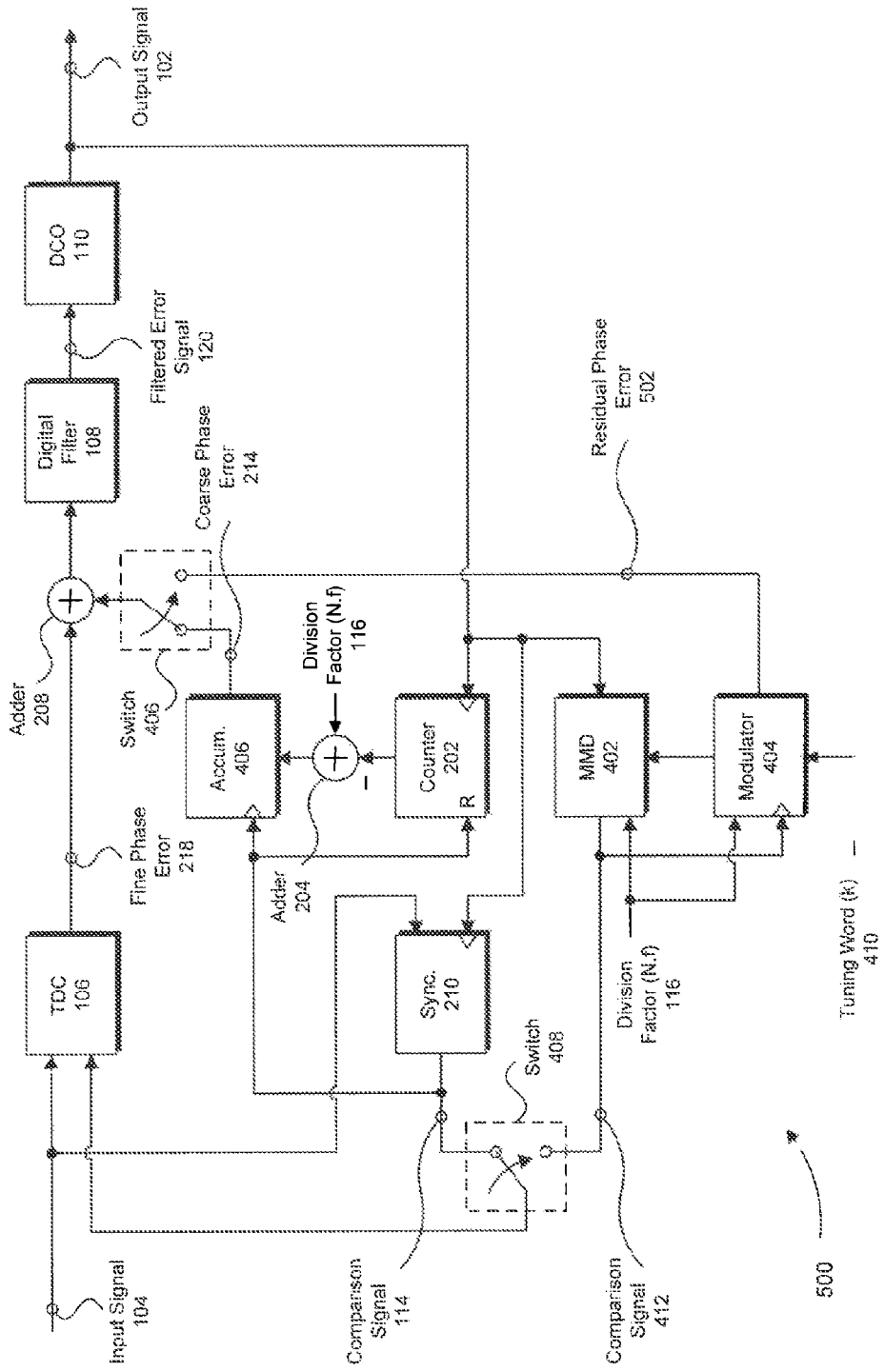
FIG. 5 illustrates a DPLL with a wide pull-in range, low phase noise, and reduced spurs in accordance with embodiments of the present disclosure.

IV. Digital Phase-Locked Loop with Wide Pull-in Range, Low Phase Noise, and Reduced Spurs FIG. 5 illustrates a solution to the disadvantage of increased spurs in the output signal 102 as a result of the MMD 402 as described above. In particular, FIG. 5 illustrates a DPLL 500 that modifies the configuration of the DPLL 400 to feed the value in the (at least one) phase error accumulator of the modulator 404, or a value based on and/or proportional thereto, into the adder 208. In general, it can be shown that the value of the phase error accumulator tracks the phase noise introduced by the MMD 402. Thus, subtracting the value stored in the phase error accumulator of the modulator 404, or a value based on and/or proportional thereto, from the fine phase error 218 helps to compensate for the phase error introduced by the MMD 402 and thereby reduce the spurs. The value in the phase error accumulator of the modulator 404 can be referred to as the residual phase error 502 as shown in FIG. 5.

It should be noted that the residual phase error 502 is provided to the adder 208 when the loop containing the MMD 402 and the modulator 404 is enabled. It is not provided to the adder 208 when the counter based loop is enabled. The switch 406 can be further used to accomplish this functionality.

It should be noted that an adaptive gain mechanism (not shown) can be further included in the DPLL 500 to dynamically tune or adjust the fine phase error 218 at the output of the TDC 106 such that the fine phase error 218 and the residual phase error 502 have matched gains (or, alternatively, the adaptive gain mechanism can adjust the residual phase error 502). The adaptive gain mechanism generally should be activated only after the DPLL 500 is in a locked state. The adaptive gain mechanism can estimate any gain mismatch between the two signals using the input signal or the output signal of the digital filter 108. The adaptive gain mechanism can implement several different algorithms for matching the gains of the two signals. For example a least mean squares (LMS) algorithm can be used. Gain matching the two signals can help to prevent spurs at the output signal 102.

Figure 6:
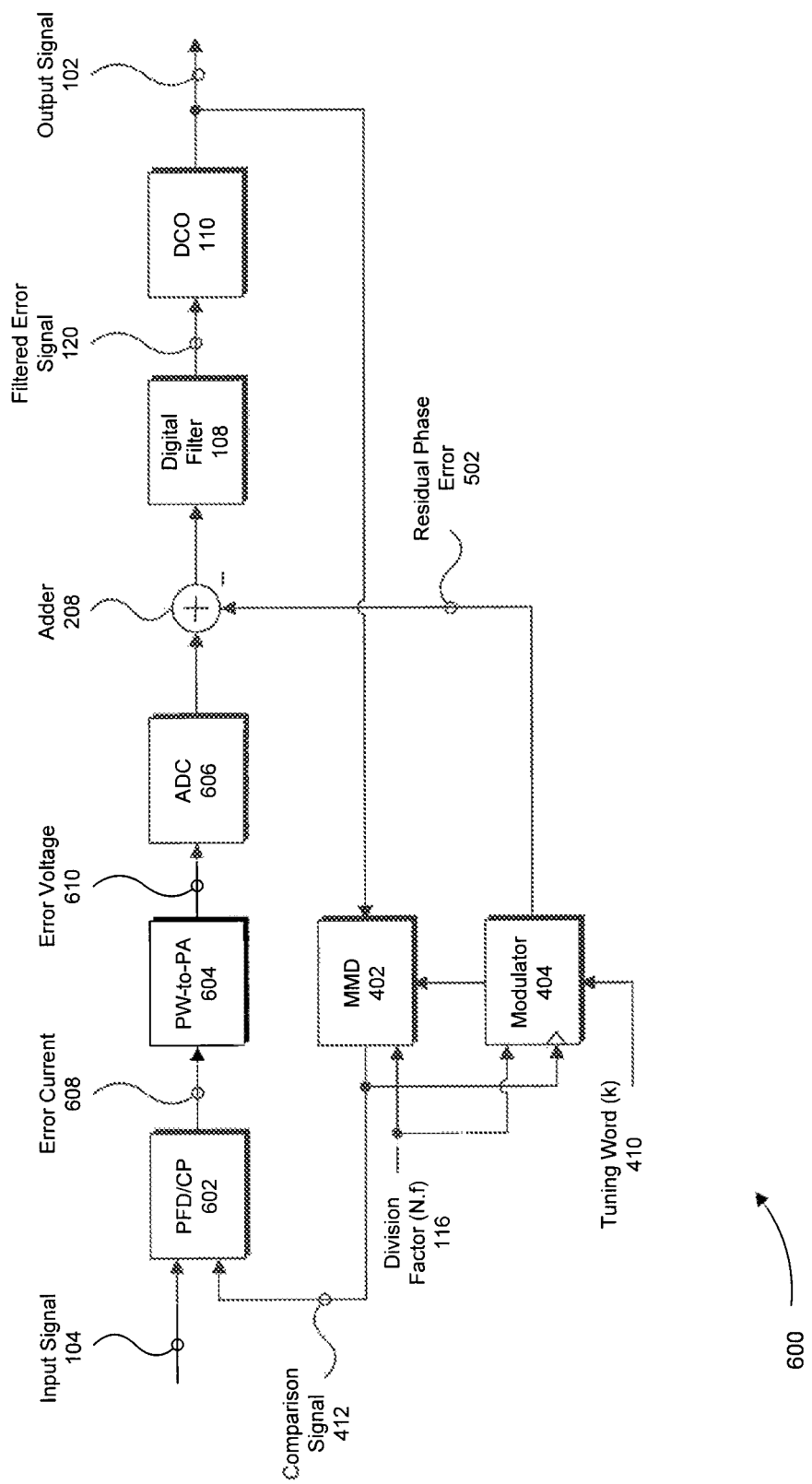
FIG. 6 illustrates a hybrid PLL (HPLL) with a wide pull-in range, low phase noise, and reduced spurs in accordance with embodiments of the present disclosure.

V. Hybrid Phase-Locked Loop with Wide Pull-in Range, Low Phase Noise, and Reduced Spurs FIG. 6 illustrates a hybrid PLL (HPLL) 600 (i.e., a PLL that includes component(s) that process and/or provide continuous-time signals, as well as component(s) that process and/or provide discrete-time signals) in accordance with embodiments of the present disclosure. A HPLL can be considered a specific type of DPLL.

The HPLL 600 illustrated in FIG. 6 includes a similar configuration as the DPLL 500 illustrated in FIG. 5. However, the HPLL 600 replaces the TDC 106 with three components: a phase frequency detector and charge pump (PFD/CP) 602, a pulse-width-to-pulse-amplitude (PW-to-PA) module 604, and an analog-to-digital converter (ADC) 606. In general, the phase frequency detector outputs a continuous-time signal and does not limit the pull-in range of a PLL like the TDC 106. Therefore, the counter based loop illustrated in FIG. 5, which was used to improve the poor pull-in range of the DPLL 500 as a result of the TDC 106, can be omitted in the HPLL 600.

In operation of the HPLL 600, the MMD 402 generates the comparison signal 412 based on the output signal 102. Specifically, the MMD 402 reduces the frequency of the output signal 102, on average, by the division factor 116 that includes an integer (N) and fractional part (f). The PFD of the PFD/CP 106 detects a difference in frequency and phase between the input signal 104 and the comparison signal 412 and provides as output an "UP" pulse if the difference is positive and a "DOWN" pulse if the difference is negative. The width of the pulse is generally proportional to the magnitude of the difference. In at least one implementation, the CP of the PFD/CP 106 drives a pulse of current into the PW-to-PA module 604 based on the duration of any UP pulses and draws a pulse of current from the PW-to-PA module 604 for the duration of any DOWN pulses. The current provided by the CP of the PFD/CP 602 is labeled as error current 608 in FIG. 6.

The PW-to-PA module 604 integrates the error current 608 over a cycle of the input signal 104 and provides this integrated value to an ADC 606, or some value based on or proportional to this integrated value to the ADC 606. The integration converts the width of the current pulses of the error current 608 into a signal with a proportional amplitude. For example, the PW-to-PA 604 can use a capacitor to integrate the error current 608 into a proportional voltage, which can then be provided as output. The capacitor can be discharged using a switch. The ADC 606 converts the integrated value, labeled as the error voltage 610 in FIG. 6, into a digital value. In an embodiment, the ADC 606 is a flash ADC or a continuous-time delta-sigma ADC.

Figure 7:
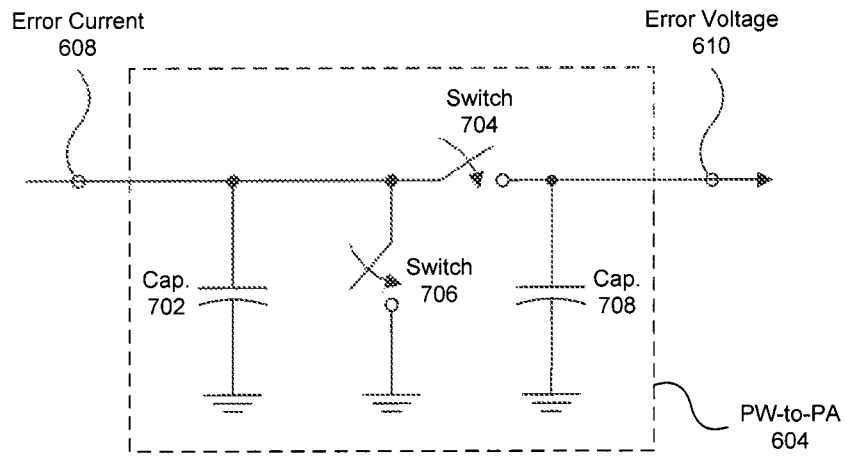
FIG. 7 illustrates an example implementation of a pulse-width-to-pulse amplitude (PW-to-PA) module in accordance with embodiments of the present disclosure.

FIG. 7 illustrates one example implementation of the PW-to-PA module 604 in accordance with embodiments of the present disclosure. As illustrated in FIG. 7, the PW-to-PA module 604 receives as input the error current 608. The capacitor 702 is configured to integrate the error current 608 over a cycle of the input signal 104. During the integration of the error current 608 by the capacitor 702, the switch 704 and the switch 706 are both open.

After a cycle of the input signal 104, the switch 704 is closed and the voltage on the capacitor 702 appears substantially at the output of the PW-to-PA module 604 as the error voltage 610. The ADC 606 then samples and converts the error voltage 610 into a digital value. In the implementation of the PW-to-PA module 604 shown in FIG. 7, the ADC 606 can specifically be implemented as a flash ADC, for example. The capacitor 708 can be comparatively smaller than capacitor 702 to prevent excess charge sharing between the two capacitors. In general, the capacitor 708 introduces a complex impedance that allows the error signal 610 to be read as a voltage signal.

After the sample of the error voltage 610 is taken by the ADC 606, the switch 704 re-opens and the switch 706 closes to discharge the capacitor 702 to prepare for the next cycle of the input signal 104.

Figure 8:
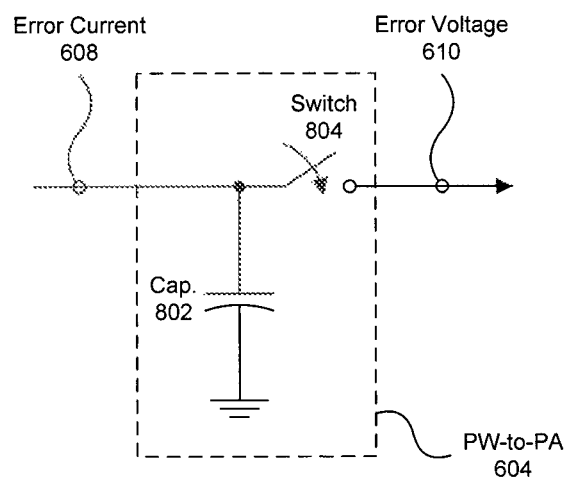
FIG. 8 illustrates another example implementation of a pulse-width-to-pulse amplitude (PW-to-PA) module in accordance with embodiments of the present disclosure.

FIG. 8 illustrates another implementation of the PW-to-PA module 604 in accordance with embodiments of the present disclosure. As illustrated in FIG. 8, the PW-to-PA module 604 receives as input the error current 608. The capacitor 802 is configured to integrate the error current 608 over a cycle of the input signal 104. During the integration of the error current 608 by the capacitor 802, the switch 804 is open.

After a cycle of the input signal 104, the switch 804 is closed and the voltage on the capacitor 802 appears substantially at the output of the PW-to-PA module 604 as the error voltage 610. The ADC 606 then samples and converts the error voltage 610 into a digital value. In the implementation of the PW-to-PA module 604 shown in FIG. 8, the ADC 606 can specifically be implemented as a second-order continuous-time delta-sigma ADC. Because of the typical implementation of a second-order continuous-time delta-sigma ADC, the switch 706 and the additional capacitor 708, shown in FIG. 7, are generally redundant and can be omitted. Also, it should be noted that, because the additional capacitor 708 is omitted, the error voltage 610 labeled in FIG. 8 can be more aptly referred to as an error current.

Referring back to FIG. 6, after the error voltage 610 has been converted into a digital value by the ADC 606, the residual phase error 502, or a value based on and/or proportional thereto, is then subtracted by the adder 208 from the digital value provided by the ADC 606 to reduce the noise introduced by the MMD 402. As discussed above in FIG. 5, the residual phase error 502 tracks this noise introduced by the MMD 402 in the comparison signal 412 and thus can be used to cancel the noise. The digital filter 108 low-pass filters the output of the adder 208 to produce the filtered error signal 120. The filtered error signal 120 is then applied to the DCO 110 to correct for any phase and frequency error between the input signal 104 and the comparison signal 412.

Although FIG. 6 simply shows the residual phase error 502 being directly fed from the modulator 404 and subtracted from the digital value provided by the ADC 606 to reduce the noise introduced by the MMD 402, in general the gain and timing of the residual phase error 502 is first adjusted before being fed from the modulator 404 and subtracted from the digital value provided by the ADC 606. The adjustment in gain and timing of the residual phase error 502 is done to (ideally) match the gain and timing changes the noise introduced by the MMD 402 undergoes by the PFD/CP 602, the PW-to-PA module 604, and the ADC 606. If adequate matching is not achieved, cancellation of the noise introduced by the MMD 402 can be poor, resulting in spurs in the output signal 102.

Figure 9:
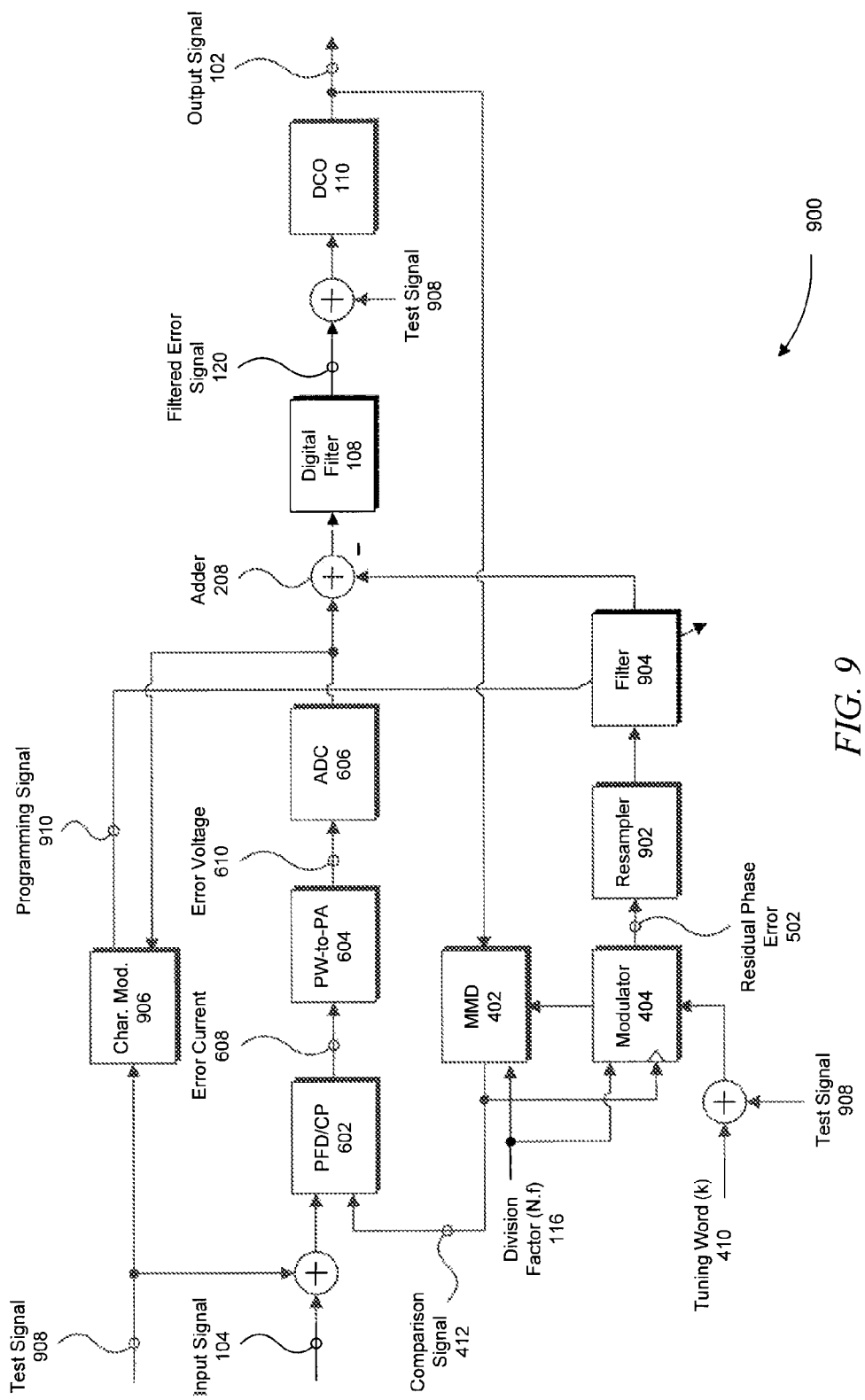
FIG. 9 illustrates a hybrid PLL (HPLL) with a wide pull-in range, low phase noise, and reduced spurs in accordance with embodiments of the present disclosure.

FIG. 9 illustrates a HPLL 900 in accordance with embodiments of the present disclosure. The HPLL 900 includes a similar configuration as the HPLL 600 illustrated in FIG. 6. However, the HPLL 900 further includes a resampler 902, a filter 904, and a characterization module 906. In general, these three blocks have been added to adjust the gain and timing (e.g., clock domain) of the residual phase error 502 to (ideally) match the gain and timing changes that the noise introduced by the MMD 402 undergoes by one or more of the PFD/CP 602, the PW-to-PA module 604, and the ADC 606.

The output of the ADC 606 can be synchronized to a different clock than the output of the MMD 402, i.e., the output of the ADC 606 can be synchronized to a different clock than the comparison signal 412. Therefore, because the phase error accumulator of the modulator 404 is synchronized and increments according to the comparison signal 412, the residual phase error 502 provided by the phase error accumulator of the modulator 404 should be synchronously resampled at the rate of the clock signal in which the output of the ADC 606 is synchronized. The resampler 902 can be used to synchronously resample the residual phase error 502 at the rate of the clock signal in which the output of the ADC 606 is synchronized. In at least one implementation, the resampler 902 can include a Farrow-type structure (e.g., first order polynomial interpolation). This resampling of the residual phase error 502 places the signal in the same clock domain as the output signal of the ADC 606.

The residual phase error 502 can be further processed by the filter 904 to "distort" (or process) the residual phase error 502 in the same or similar manner as the noise introduced by the MMD 402 in comparison signal 412 is "distorted" (or processed) by one or more of the PFD/CP 602, the PW-to-PA module 604, and the ADC 606. To accomplish this functionality, the filter 904 (either a finite impulse response (FIR) filter or a infinite impulse response (IIR) filter) can be "programmed" to have a similar frequency response as the cascaded combination of one or more of the PFD/CP 602, the PW-to-PA module 604, and the ADC 606.

The characterization module 906 can be used to estimate the frequency response of the cascaded combination of one or more of the PFD/CP 602, the PW-to-PA module 604, and the ADC 606. Once estimated, the characterization module 906 can then program the filter 904, via programming signal 910, based on the estimation. For example, the characterization module 906 can program appropriate weights or coefficients for taps of the filter 904 based on the estimated frequency response.

To perform the frequency response estimation of the cascaded combination of one or more of the PFD/CP 602, the PW-to-PA module 604, and the ADC 606, a test signal 908 that includes a tone with increasing frequency is injected into the forward path of the HPLL 900 by phase modulating the input signal 104 (or, alternatively, through the modulator 404 or the DCO 110 as shown in FIG. 9). The frequency response of the cascaded combination of one or more of the PFD/CP 602, the PW-to-PA module 604, and the ADC 606 is estimated by characterization module 906 by measuring the amplitude and phase of the injected tone at the output of the ADC 606. This method is equivalent to frequency sampling of the frequency response of the cascaded combination of one or more of the PFD/CP 602, the PW-to-PA module 604, and the ADC 606. Two alternative mechanisms that can be included in the characterization module 906 for measuring the amplitude and phase of the tone are further illustrated in FIGS. 10A and 10B.

Figure 10A:
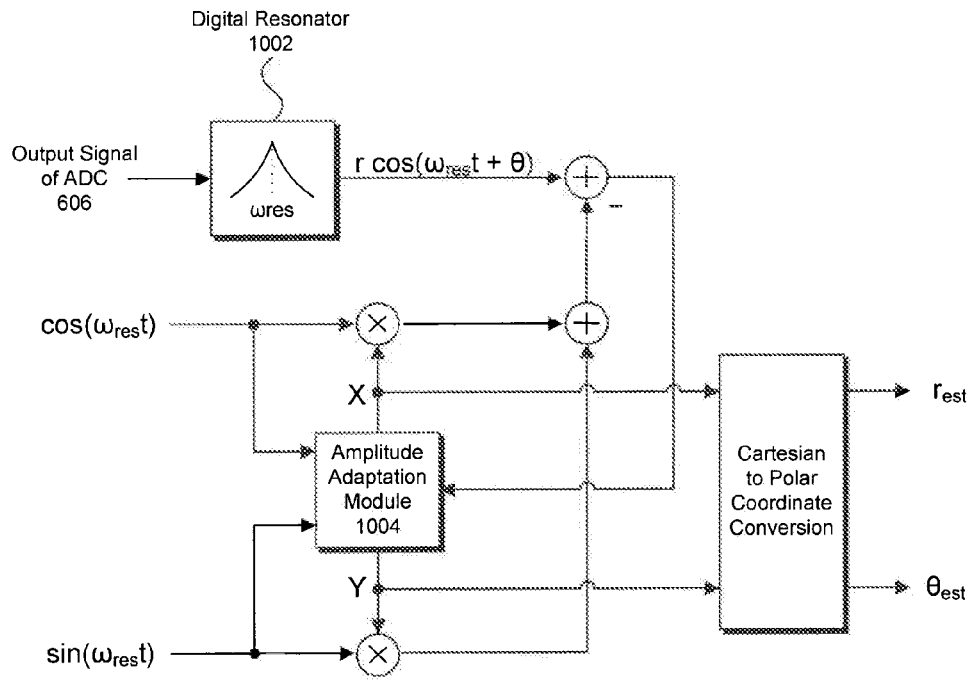
FIG. 10A illustrates a mechanism for measuring the amplitude and phase of a tone in accordance with embodiments of the present disclosure.
Figure 10B:
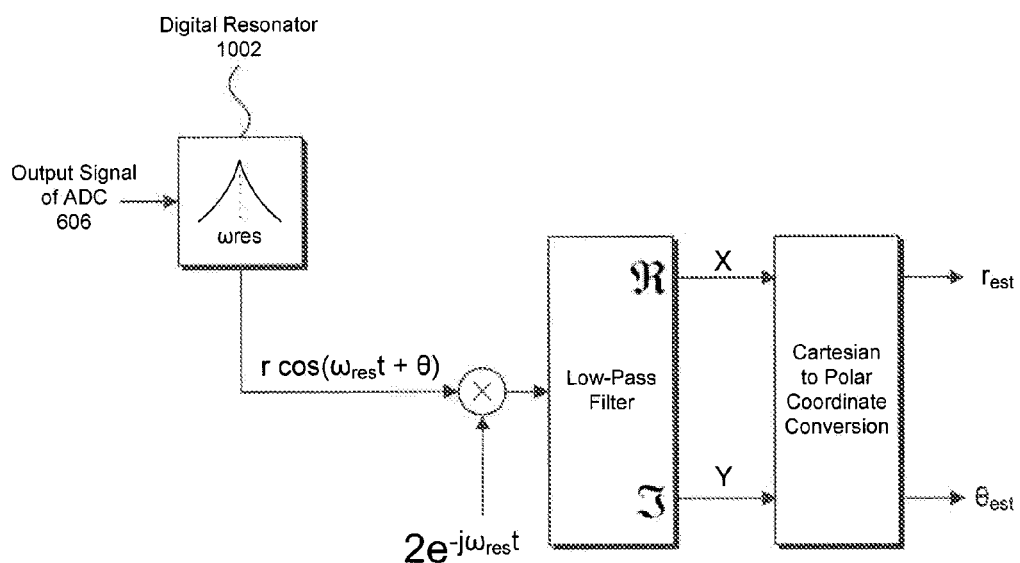
FIG. 10B illustrates an alternative mechanism for measuring the amplitude and phase of a tone in accordance with embodiments of the present disclosure.

As shown in FIG. 10A, the output signal of the ADC 606, which includes the processed test signal 908, is passed through a resonator 1002. At any given point in time, the test signal 908 includes a tone at a particular frequency. The resonator 1002 is tuned to the particular frequency to extract the processed tone of the test signal 908 from the output signal of the ADC 606. As will be readily understood, the frequency response of the cascaded combination of one or more of the PFD/CP 602, the PW-to-PA module 604, and the ADC 606 at the particular frequency of the tone can be characterized based on the change in the tones amplitude and phase as measured at the output of the ADC 606. The extracted tone can be written as $r \cos(\Omega_{res}t+\theta) = I \cos(\Omega_{res}t) + Q \sin(\omega_{res}t)$, where I and Q are the Cartesian In-phase and Quadrature projections, respectively, of $r \cos(\Omega_{res}t+\theta)$ on a basis that is composed of two sinusoidal components in quadrature. In general r and θ are corrupted by noise. They can be accurately estimated by adaptively cancelling out such noise, using amplitude adaptation module 1004, as shown in the mechanism of FIG. 10A. Alternatively, they can be estimated by complex frequency translation followed by low-pass filtering (e.g., using a CORDIC algorithm) as highlighted in FIG. 10B.

Figure 11:
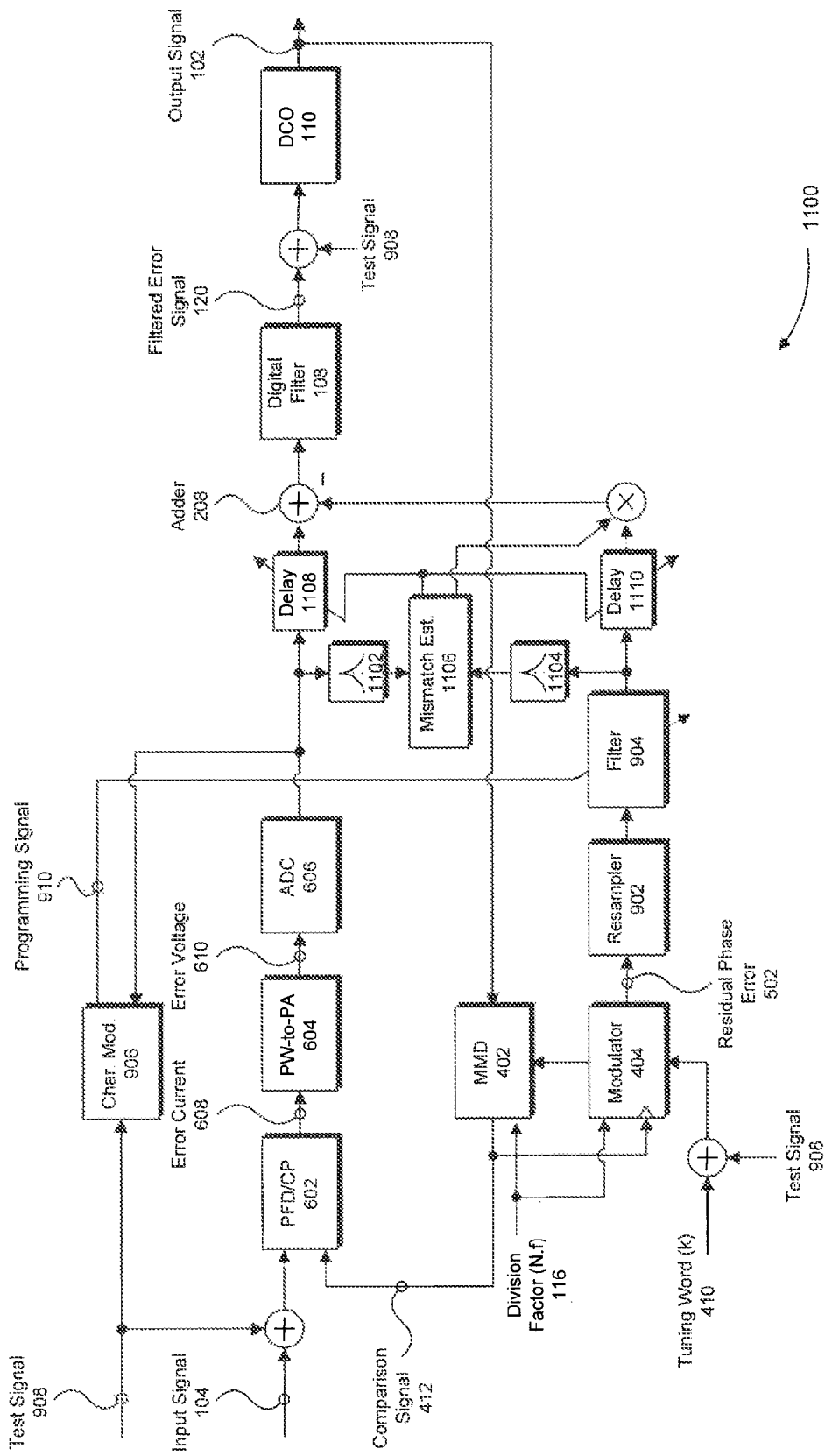
FIG. 11 illustrates a hybrid PLL (HPLL) with a wide pull-in range, low phase noise, and reduced spurs in accordance with embodiments of the present disclosure.

FIG. 11 illustrates a HPLL 1100 in accordance with embodiments of the present disclosure. The HPLL 1100 includes a similar configuration as the HPLL 900 illustrated in FIG. 9. However, the HPLL 1100 further includes two resonators 1102 and 1104, a mismatch estimator 1106, and two variable delay elements 1108 and 1110.

These additional blocks can be used to fine tune the gain and timing mismatches between the cancellation signal (i.e., residual phase error 502) and the noise introduced by the MMD 402 at the output of ADC 606. This fine tuning approach is based on the mechanism for measuring the amplitude and phase of an injected tone as describe above in FIG. 10. The cancellation signal is to be matched both in time and gain, as noted above, with the noise introduced by the MMD 402 at the output of the ADC 606. The noise introduced by the MMD 402 is generally composed of a number of harmonics which are linearly combined according to Fourier series theory. Therefore, for envelope gain/delay matching purposes it suffices to identify the gain/delay mismatches of a selected same harmonic from each of the cancellation signal and the noise introduced by the MMD 402 at the output of the ADC 606. Probing a particular harmonic (of relatively high frequency) as opposed to using the complete harmonic composition in the adaptation algorithm can improve the gain/delay estimation quality and speed of convergence. The cancellation paths gain mismatch is found as the ratio of the estimated probed tone envelopes and their delay mismatch as the difference between the estimated phases of the probed tones. The phase mismatch can be positive or negative, hence two variable delay elements 1108 and 1110 are shown. Alternatively, a fixed delay can be introduced in the forward path the HPLL 1100 so that the signal in the digital cancelation path will need to be delayed. The fixed delay can eliminate the need for one of the variable delay elements 1108 and 1110.

In reference to FIG. 9, an alternative way to address the gain and timing mismatch problem at the inputs of the adder 208 concerns the processing of the output of the filter 904 according to the formula: Y=g*X+d. The value g is adaptively tuned, for example by an LMS algorithm using the input or the output of the digital filter 108 as an error function. The value d represents an additive offset value that is proportional to the number of pulses in the output signal 102 provide by the DCO 110 elapsing between a pulse fed to the resampler 902 and the respective pulse produced as an output of the resampler 902. This allows the synchronization of the two adder inputs within the accuracy of a cycle of the output signal provided by the DCO 102.

Figure 12:
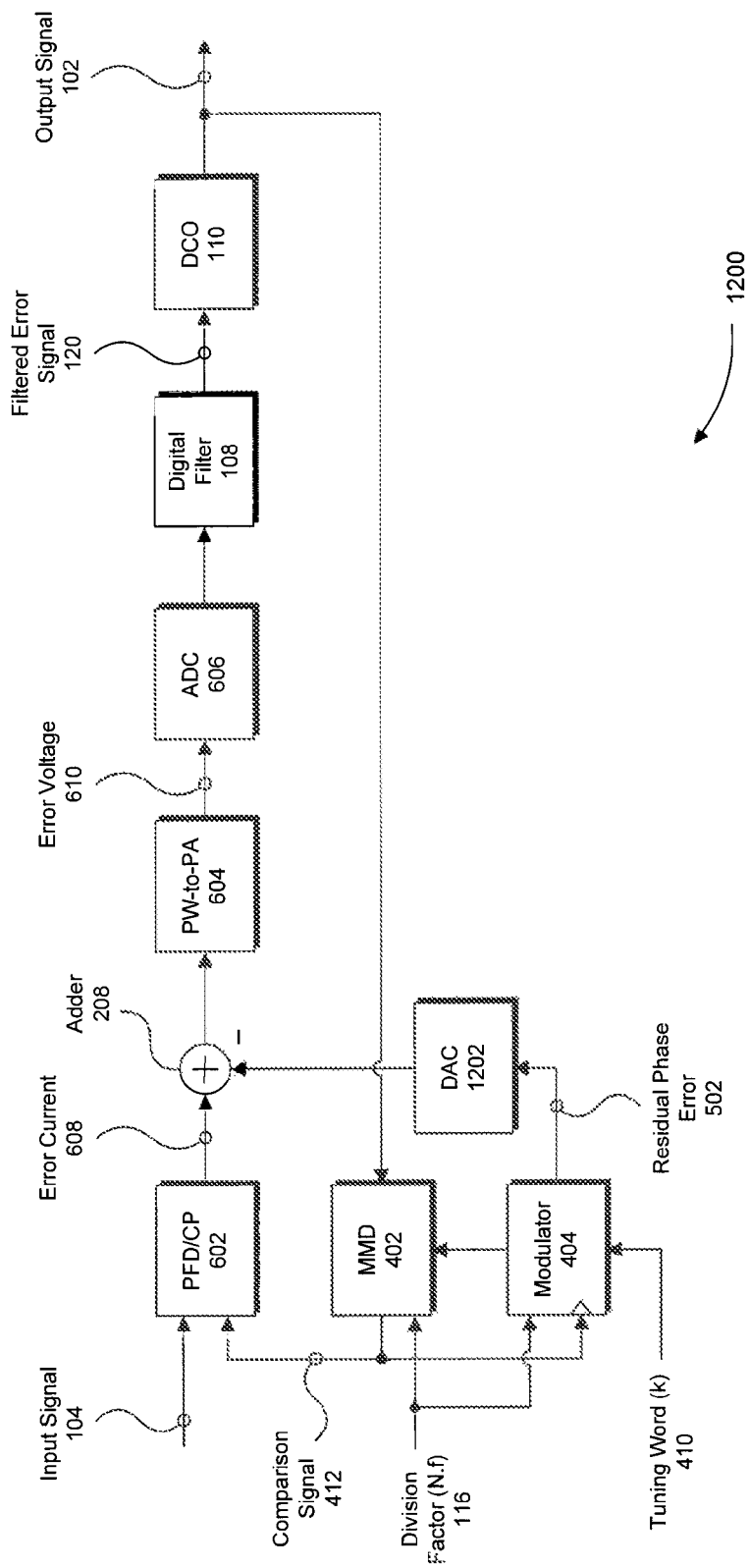
FIG. 12 illustrates a variant of the hybrid PLL (HPLL) illustrated in FIG. 6 in accordance with embodiments of the present disclosure.

FIG. 12 illustrates a HPLL 1200 with a similar configuration as the HPLL 600 shown in FIG. 6. The HPLL 1200 includes the additional component of a digital-to-analog converter (DAC) 1202 for converting the residual phase error 502, or a value proportional thereto, into a current pulse with a width proportional to the residual phase error 502. This permits the residual phase error 502 to be removed in the analog domain as shown. In particular, the residual phase error 502, or a value proportional thereto, can be "subtracted" from the error current 608, generated by the PFD/CP 602, using the adder 208, which has been repositioned as shown. The current pulses produced at the output of the DAC 1202 and the current pulses of error current 608, in at least one implementation of the HPLL 1200, generally do not overlap. In this instance, the adder 208 reduces to a simple connection node. Essentially, the addition operation takes the form of adding charges on the capacitors 702 and 802, shown in FIGS. 7 and 8 respectively.

In an embodiment, the DAC 1202 is a flash DAC, which allows the ADC 606 to be implemented as a delta-sigma ADC. The DAC 1202 can further include delta-sigma dithering.

Figure 13:
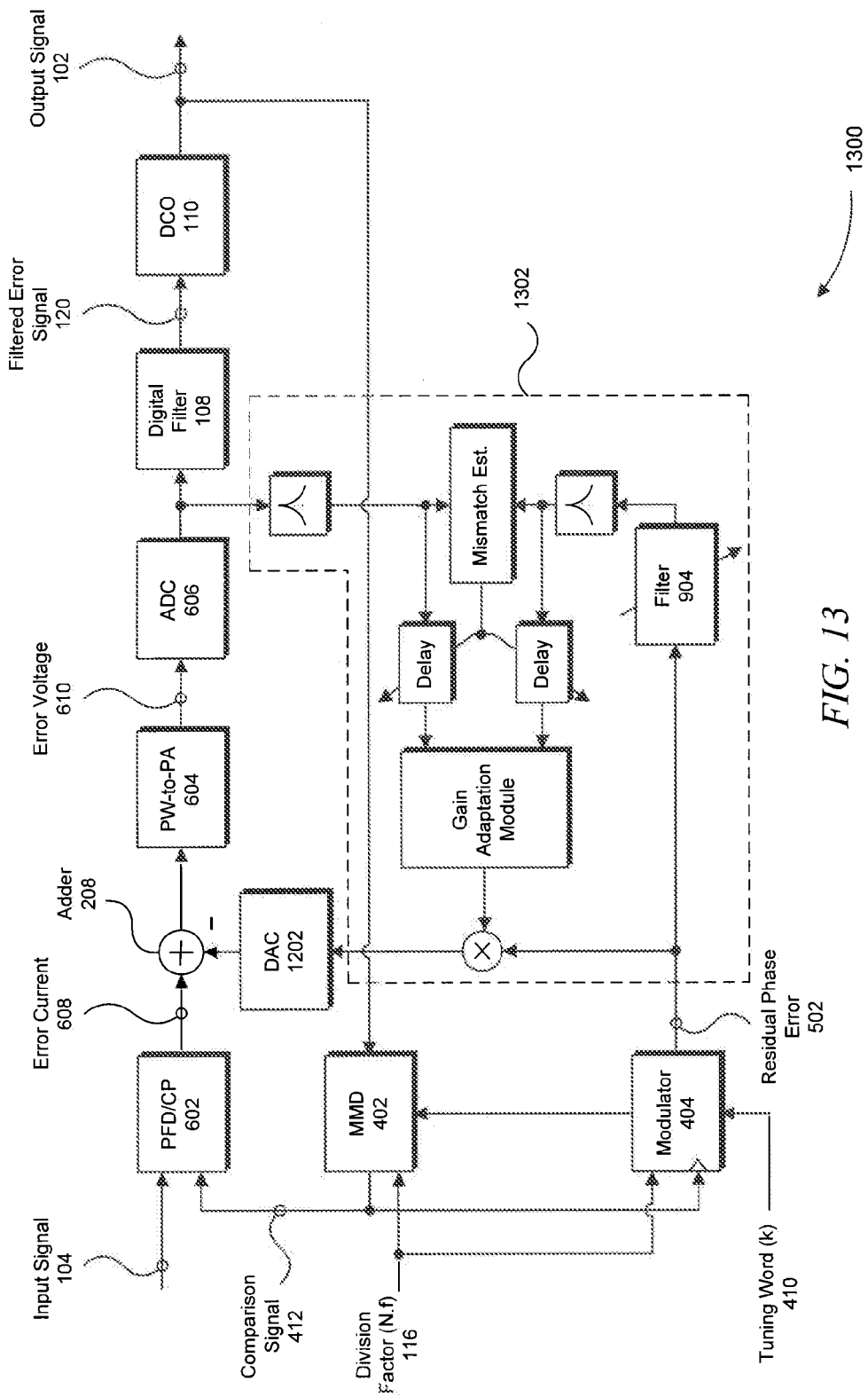
FIG. 13 illustrates another variant of the hybrid PLL (HPLL) illustrated in FIG. 6 in accordance with embodiments of the present disclosure.

FIG. 13 illustrates a HPLL 1300 with a similar configuration as the HPLL 1200 shown in FIG. 12. The HPLL 1300 includes the additional mechanism 1302 for adaptively correcting for gain mismatch between the cancellation paths due to, for example, process, voltage, and temperature (PVT) variations.

The robustness of the gain adaption module (e.g., speed of convergence) shown in FIG. 13 highly depends on the relative alignment of the signals that drive the adaptation process it performs, i.e., the residual phase error 502 and the error signal at the output of the ADC 606. The filter 904, configured as described above in FIG. 11, is utilized to distort the residual phase error 502 in the same way the PFD/CP error signal has been distorted as propagating to the output of the ADC 606. The gain adaptation process is driven by a selected same harmonic from each of the cancellation signals (i.e., residual phase error 502 and the output of the ADC 606), which are first finely aligned prior to gain adaptation in accordance with the probing mechanism, which was described above in the context of FIG. 11. The extracted and conditioned tones drive the gain adaptation process via the gain adaptation module.

VI. Conclusion

The present disclosure has been described above with the aid of functional building blocks illustrating the implementation of specified functions and relationships thereof The boundaries of these functional building blocks have been arbitrarily defined herein for the convenience of the description. Alternate boundaries can be defined so long as the specified functions and relationships thereof are appropriately performed.

What is claimed is:

1. A digital phase-locked loop (DPLL) for establishing and maintaining a phase relationship between an output signal and an input signal, the DPLL comprising:
   a synchronizer configured to synchronize the input signal with the output signal to provide a first comparison signal;
   an accumulator configured to accumulate a difference between a desired division factor and a number of edges of the output signal that occur during a cycle of the first comparison signal to provide a coarse phase error;
   a multi-modulus divider (MMD) configured to reduce a frequency of the output signal, on average, by the desired division factor to provide a second comparison signal;
   a time-to-digital converter (TDC) configured to detect a fine phase error based on a difference in phase between the input signal and the first comparison signal if the DPLL is in a non-locked state or detect the fine phase error between the input signal and the second comparison signal if the DPLL is in a locked state; and
   a digitally controlled oscillator (DCO) configured to adjust the frequency of the output signal based on the fine phase error and, if the DPLL is in the non-locked state, the coarse phase error.

2. The DPLL of claim 1, further comprising:
   a modulator configured to control the MMD to alternately reduce the frequency of the output signal by at least a first integer division factor and a second integer division factor to provide the second comparison signal.

3. The DPLL of claim 2, wherein the modulator is a sigma delta modulator.

4. The DPLL of claim 2, wherein the modulator comprises:
   a residual phase error accumulator configured to increment a residual phase error based on a tuning word after a cycle of the second comparison signal.

5. The DPLL of claim 4, wherein the tuning word represents a fractional part of the desired division factor.

6. The DPLL of claim 4, wherein the residual phase error accumulator is further configured to control the MMD to switch from reducing the frequency of the output signal by the first integer division factor to reducing the frequency of the output signal by the second integer division factor.

7. The DPLL of claim 4, wherein the DCO is further configured to adjust the frequency of the output signal based on the residual phase error if the DPLL is in the locked state.

8. The DPLL of claim 1, wherein the synchronizer is configured to synchronize the input signal with the output signal by registering the input signal in a storage element that is clocked by the output signal.

9. The DPLL of claim 1, further comprising:
   a counter configured to count the number of edges of the output signal that occur during the cycle of the first comparison signal.

10. The DPLL of claim 9, wherein the edges are rising edges.

11. The DPLL of claim 9, wherein the counter is configured to be reset by the first comparison signal.

12. A method for controlling a digital phase-locked loop (DPLL) to establish and maintain a phase relationship between an output signal and an input signal, the method comprising:
   synchronizing the input signal with the output signal to provide a first comparison signal,
   accumulating a difference between a desired division factor and a number of edges of the output signal that occur during a cycle of the first comparison signal to provide a coarse phase error,
   reducing a frequency of the output signal, on average, by the desired division factor to provide a second comparison signal,
   if the DPLL is in a non-locked state, detecting a fine phase error based on a difference in phase between the input signal and the first comparison signal and adjusting the frequency of the output signal based on the fine phase error and the coarse phase error; and if the DPLL is in a locked state, detecting the fine phase error between the input signal and the second comparison signal and adjusting the frequency of the output signal based on the fine phase error.

13. The method of claim 12, further comprising:
controlling a multi-modulus divider (MMD) to alternately reduce the frequency of the output signal by at least a first division factor and a second division factor to provide the second comparison signal.

14. The method of claim 13, further comprising:
incrementing a residual phase error based on a tuning word after a cycle of the second comparison signal.

15. The method of claim 14, wherein the tuning word represents a fractional part of the desired division factor.

16. The method of claim 14, further comprises:
controlling the MMD to switch from reducing the frequency of the output signal by the first division factor to reducing the frequency of the output signal by the second division factor.

17. The method of claim 14, further comprising:
if the DPLL is in the locked state, adjusting the frequency of the output signal based on the residual phase error.

* * * * *